(12) United States Patent
Wang et al.

(10) Patent No.: US 12,603,650 B2
(45) Date of Patent: Apr. 14, 2026

(54) ACTIVE GATE DRIVER

(71) Applicant: NATIONAL SUN YAT-SEN UNIVERSITY, Kaohsiung (TW)

(72) Inventors: Chua-Chin Wang, Kaohsiung (TW); Oliver Lexter July A. Jose, Kaohsiung (TW); Venkata Naveen Kolakaluri, Kaohsiung (TW); Jui-Min Kuo, Kaohsiung (TW); Ming-Chi Chou, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 58 days.

(21) Appl. No.: 18/940,244

(22) Filed: Nov. 7, 2024

(65) Prior Publication Data

US 2025/0293688 A1 Sep. 18, 2025

(30) Foreign Application Priority Data

Mar. 15, 2024 (TW) ................................. 113109588

(51) Int. Cl.
H03K 19/00 (2006.01)
H03K 3/037 (2006.01)
(Continued)

(52) U.S. Cl.
CPC ....... H03K 19/0013 (2013.01); H03K 3/0377 (2013.01); H03K 19/00315 (2013.01);
(Continued)

(58) Field of Classification Search
CPC ............. H03K 19/0013; H03K 3/0377; H03K 19/00315; H03K 19/00323; H03K 19/018521
See application file for complete search history.

(56) References Cited

U.S. PATENT DOCUMENTS 10,790,818 B1 * 9/2020 Frank ................... H03K 17/168
2015/0372678 A1 * 12/2015 Zhang ............ H03K 19/017509
327/109

(Continued)

FOREIGN PATENT DOCUMENTS

CN 112583389 A 3/2021
CN 116388742 A 7/2023
EP 3799308 A1 3/2021

OTHER PUBLICATIONS

Camacho et al. "A Novel Active Gate Driver for Improving SiC MOSFET Switching Trajectory", 2016 IEEE (Year: 2016).*

(Continued)

*Primary Examiner* — Daniel D Chang
(74) *Attorney, Agent, or Firm* — Demian K. Jackson; Jackson IPG PLLC

(57) ABSTRACT

An active gate driver provided to drive a power transistor includes a two-level Miller plateau detector, a cycle shifter, a flexible split-path feedback circuit, a PMOS switch picker, a NMOS switch picker, a PMOS buffer array and a NMOS buffer array. The active gate driver turns off some PMOS transistors of the PMOS buffer array and some NMOS transistors of the NMOS buffer array to lower power consumption when the power transistor in the Miller plateau. And the active gate driver also turns off some PMOS transistors of the PMOS buffer array if a gate-source voltage is greater than a high-potential reference voltage, thereby further reducing power consumption.

10 Claims, 7 Drawing Sheets

(51) Int. Cl.
    *H03K 19/003*     (2006.01)
    *H03K 19/0185*     (2006.01)

(52) U.S. Cl.
    CPC ................. *H03K 19/00323* (2013.01); *H03K 19/018521* (2013.01)

(56) References Cited

U.S. PATENT DOCUMENTS

2017/0155322 A1 *   6/2017   Zhang ..................... H02M 1/44
2024/0022244 A1 *   1/2024   S ......................... H02M 1/0029

OTHER PUBLICATIONS

Taiwanese office action mailed Nov. 22, 2024 for Taiwanese patent application No. 113109588, 3 pages.

Oliver Lexter July A. Jose et al., SiC MOSFET High Side Gate Driver Design Using HV CMOS Process, 2023 IEEE 66th International Midwest Symposium on Circuits and Systems (MWSCAS), Aug. 6-9, 2023.

Oliver Lexter July A. Jose et al., 2-Level Miller Detection-based High Side Gate Driver Design for Power MOSFETs, 2023 IEEE Asia Pacific Conference on Circuits and Systems (APCCAS), Nov. 19-22, 2023.

* cited by examiner

ACTIVE GATE DRIVER

CROSS-REFERENCE TO RELATED APPLICATIONS

This application claims priority to R.O.C Patent Application No. 113109588 filed Mar. 15, 2024, the disclosure of which is hereby incorporated by reference in its entirety.

FIELD OF THE INVENTION

This invention relates to a gate driver for a power transistor, and more particularly to an active gate driver.

BACKGROUND OF THE INVENTION

Power transistors are semiconductor components applied for high-power voltage and current, and they have advantages of quick switch speed and high efficiency. The conventional power transistors cannot be switched on or off fully and immediately, thus excessive current may flow through the power transistors in a split-second during switching to heat or damage the power transistors. In order to shorten the switching time of the power transistors, gate controllers are required to control the power transistors. Conventional gate controllers can be roughly divided into passive and active types, active-type gate controllers with flexible control ability can improve the efficiency of the power transistors significantly. However, the active gate controllers have complicated control and structure, that means more control time and power consumption.

SUMMARY OF THE INVENTION

One object of the present invention is to provide a two-level Miller plateau detector to know whether a power transistor is in the Miller plateau. Consequently, some of PMOS and NMOS transistors in PMOS and NMOS buffer arrays can be turned off to lower drive current when the power transistor in the Miller plateau. Otherwise, the turned-off PMOS transistors are different in every cycle by a cycle shifter to avoid asymmetric aging in the PMOS transistors of the PMOS buffer array.

An active gate driver of the present invention is provided to drive a power transistor and includes a two-level Miller plateau detector, a cycle shifter, a flexible split-path feedback circuit, a PMOS switch picker, a NMOS switch picker, a PMOS buffer array and a NMOS buffer array. The two-level Miller plateau detector is electrically connected to the power transistor to receive a gate-source voltage and a drain-source voltage of the power transistor, and the two-level Miller plateau detector compares the gate-source voltage and the drain-source voltage to a high-potential reference voltage and a low-potential reference voltage, and output a P-type Miller plateau detection signal, a N-type Miller plateau detection signal and a gate voltage detection signal. The cycle shifter receives a load voltage signal and a driving signal and output a sequence selection signal based on the load voltage signal and the driving signal. The flexible split-path feedback circuit receives the driving signal, a P-type control signal and a N-type control signal, and the flexible split-path feedback circuit output a P-type driving signal and a N-type driving signal. The PMOS switch picker is electrically connected to the two-level Miller plateau detector, the cycle shifter and the flexible split-path feedback circuit, and the PMOS switch picker receives the P-type Miller plateau detection signal, the gate voltage detection signal, the sequence selection signal and the P-type driving signal and output the P-type control signal. The NMOS switch picker is electrically connected to the two-level Miller plateau detector, the cycle shifter and the flexible split-path feedback circuit, and the NMOS switch picker receives the N-type Miller plateau detection signal and the N-type driving signal and output the N-type control signal. The PMOS buffer array is electrically connected to the PMOS switch picker to receive the P-type control signal and it is controlled by the P-type control signal to provide a gate voltage to the power transistor. The NMOS buffer array is electrically connected to the NMOS switch picker to receive the N-type control signal and it is controlled by the N-type control signal to provide a discharge path for the power transistor.

The active gate driver of the present invention utilizes the two-level Miller plateau detector to know the power transistor is in the Miller plateau or not, consequently, some of the PMOS transistors in the PMOS buffer array or some of the NMOS transistors in the NMOS buffer array can be turned off to lower power consumption while the power transistor is in the Miller plateau. Also, some PMOS transistors in the PMOS buffer array can be turned off to reduce more power consumption when the gate-source voltage exceeds the high-potential reference voltage and the drain-source voltage goes down to the low-potential reference voltage. Due to the PMOS transistors turned off by the cycle shifter in every cycle are different, asymmetric PMOS transistor aging will not be observed in the PMOS buffer array.

DETAILED DESCRIPTION OF THE INVENTION

Figure 1:
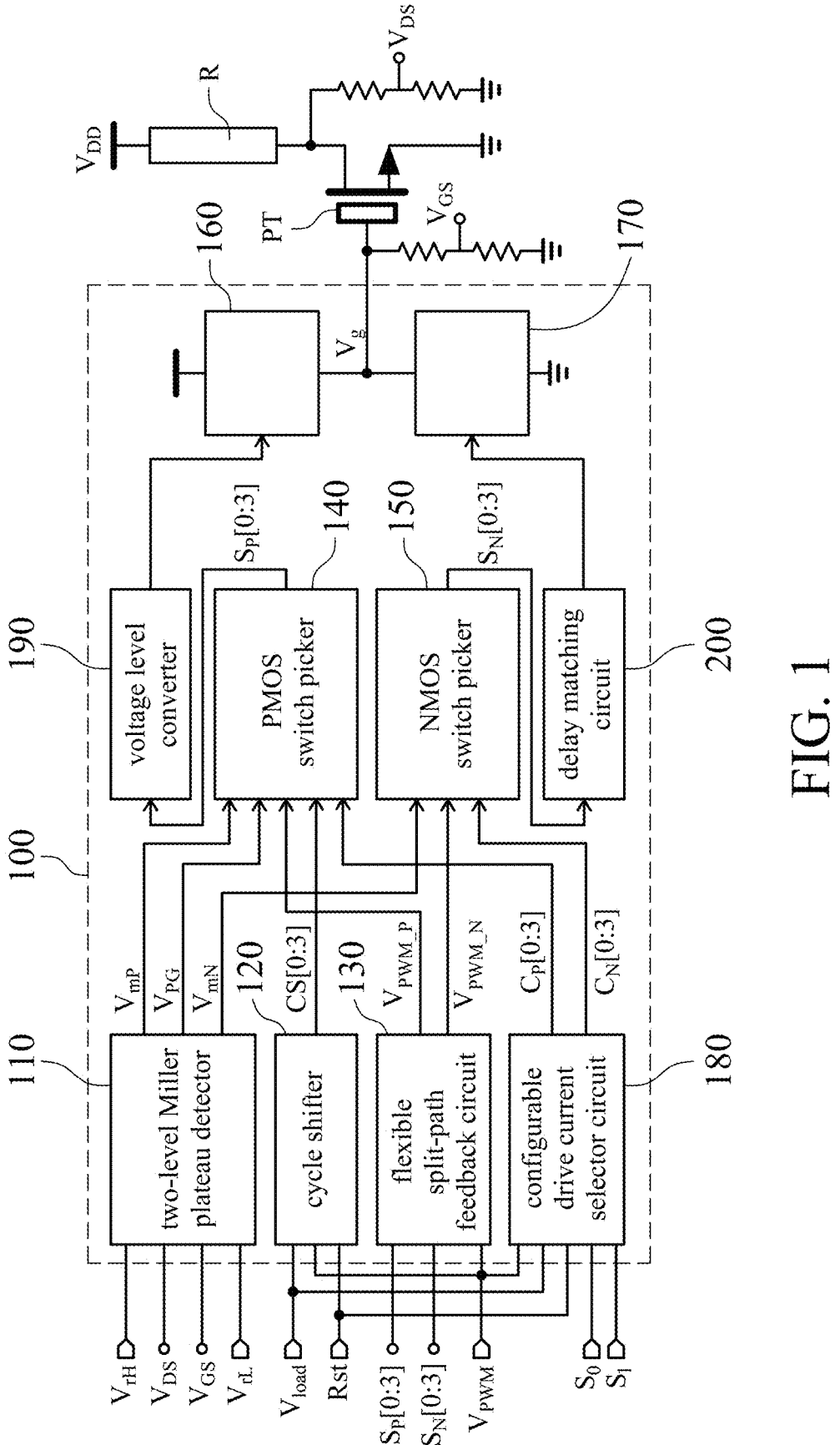
FIG. 1 is block diagram illustrating an active gate driver in accordance with one embodiment of the present invention.

With reference to FIG. 1, an active gate driver 100 in accordance with one embodiment of the present invention includes a two-level Miller plateau detector 110, a cycle shifter 120, a flexible split-path feedback circuit 130, a PMOS switch picker 140, a NMOS switch picker 150, a PMOS buffer array 160, a NMOS buffer array 170, a configurable drive current selector circuit 180, a voltage level converter 190 and a delay matching circuit 200. The active gate driver 100 can provide a gate voltage $V_g$ to a power transistor PT.

Figure 2:
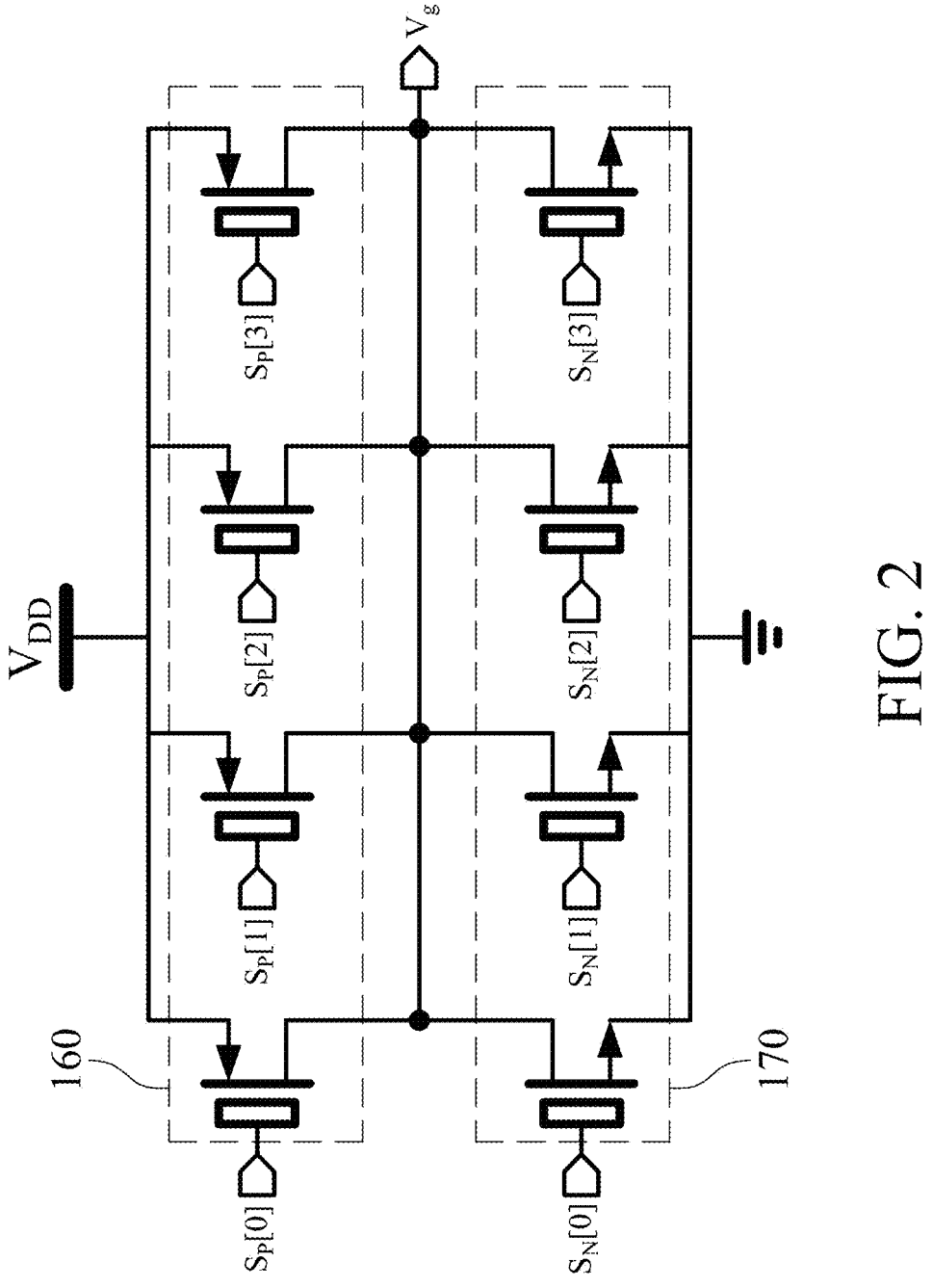
FIG. 2 is a circuit diagram illustrating a PMOS buffer array and a NMOS buffer array in accordance with one embodiment of the present invention.

With reference to FIG. 1, the drain of the power transistor PT receives a supply voltage $V_{DD}$ from a pull-up resistor R and output a drain-source voltage $V_{DS}$ via a voltage dividing circuit, the gate of the power transistor PT is electrically connected to the PMOS buffer array 160 and the NMOS buffer array 170 and output a gate-source voltage $V_{GS}$ via a voltage dividing circuit, and the source of the power transistor PT is grounded. As shown in FIG. 2, the PMOS buffer array 160 consists of four PMOS transistors, the NMOS buffer array 170 consists of four NMOS transistors, and a buffer contains one PMOS transistor and one NMOS transistor. The PMOS buffer array 160 and the NMOS buffer array 170 can provide the gate voltage $V_g$ to the power transistor PT or provide a discharge path for the gate of the power transistor PT.

With reference to FIG. 1, the two-level Miller plateau detector 110 is electrically connected to the power transistor PT to receive the gate-source voltage $V_{GS}$ and the drain-source voltage $V_{DS}$ from the two voltage dividing circuits of the power transistor PT. The two-level Miller plateau detector 110 receives a high-potential reference voltage $V_{rH}$ and a low-potential reference voltage $V_{rL}$, and it detects whether the power transistor PT in the Miller plateau depending on the gate-source voltage $V_{GS}$, the drain-source voltage $V_{DS}$, the high-potential reference voltage $V_{rH}$ and the low-potential reference voltage $V_{rL}$. The two-level Miller plateau detector 110 compares the gate-source voltage $V_{GS}$ and the drain-source voltage $V_{DS}$ of the power transistor PT to the high-potential reference voltage $V_{rH}$ and the low-potential reference voltage $V_{rL}$, and it output a P-type Miller plateau detection signal $V_{mP}$, a N-type Miller plateau detection signal $V_{mN}$ and a gate voltage detection signal $V_{PG}$. The high-potential reference voltage $V_{rH}$ is 0.8 $V_{DD}$ and the low-potential reference voltage $V_{rL}$ is 0.2 $V_{DD}$ in this embodiment, but not limited in the present invention.

Figure 3:
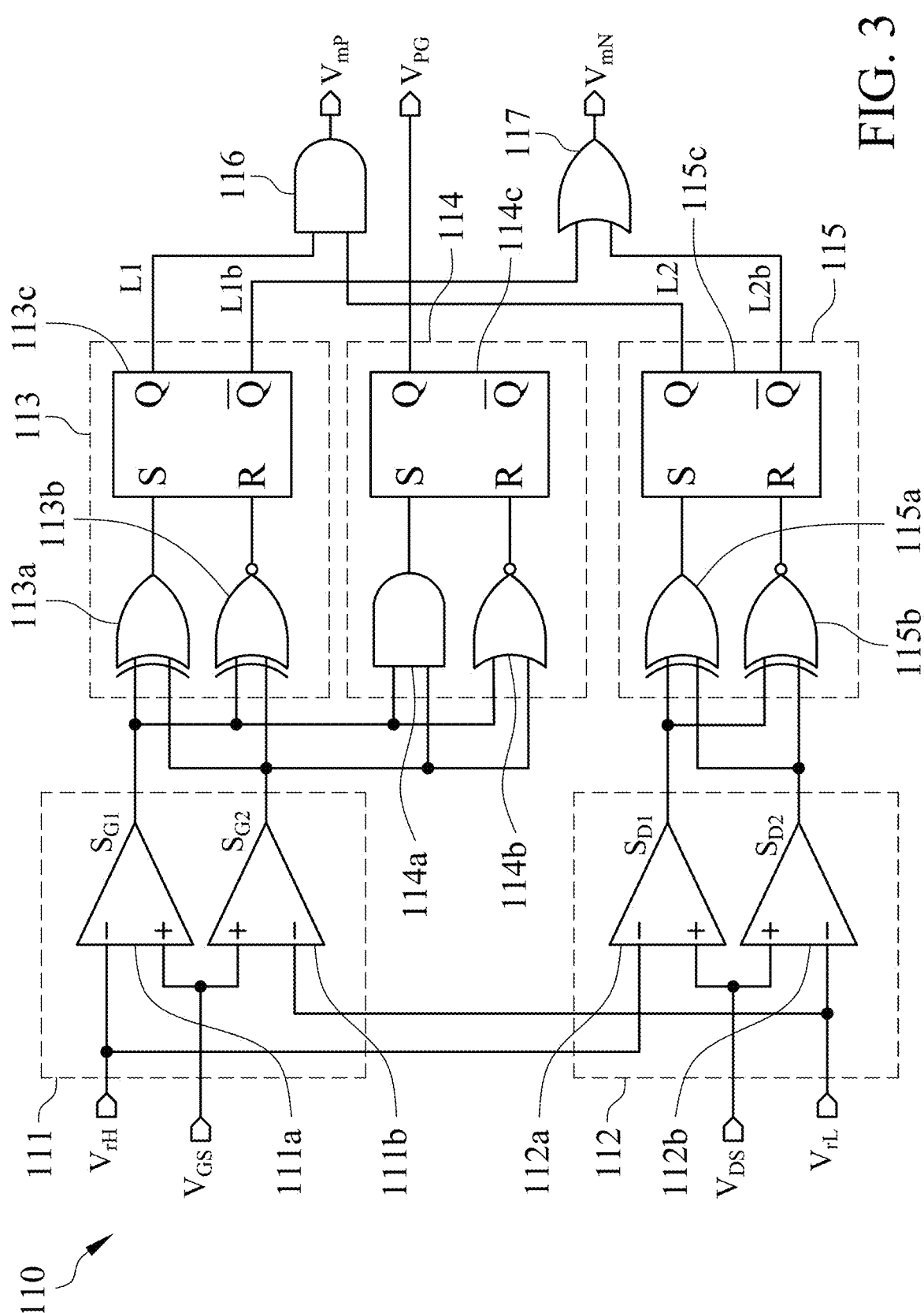
FIG. 3 is a circuit diagram illustrating a two-level Miller plateau detector in accordance with one embodiment of the present invention.

With reference to FIG. 3, the two-level Miller plateau detector 110 includes a first comparison unit 111, a second comparison unit 112, a first logic unit 113, a second logic unit 114, a third logic unit 115, a first output logic unit 116 and a second output logic unit 117 in this embodiment. The first comparison unit 111 receives the gate-source voltage $V_{GS}$, the high-potential and low-potential reference voltages $V_{rH}$ and $V_{rL}$, compares the gate-source voltage $V_{GS}$ to the high-potential and low-potential reference voltages $V_{rH}$ and $V_{rL}$ and output a first source detection signal $S_{G1}$ and a second source detection signal $S_{G2}$. The second comparison unit 112 receives the drain-source voltage $V_{DS}$, the high-potential and low-potential reference voltages $V_{rH}$ and $V_{rL}$, compares the drain-source voltage $V_{DS}$ to the high-potential and low-potential reference voltages $V_{rH}$ and $V_{rL}$ and output a first drain detection signal $S_{D1}$ and a second drain detection signal $S_{D2}$.

The first logic unit 113 is electrically connected to the first comparison unit 111 to receive the first and second source detection signals $S_{G1}$ and $S_{G2}$, and the first logic unit 113 output a first logic signal L1 and an inverted first logic signal L1$b$. The second logic unit 114 is electrically connected to the first comparison unit 111 to receive the first and second source detection signals $S_{G1}$ and $S_{G2}$, and the second logic unit 114 output the gate voltage detection signal $V_{PG}$. The third logic unit 115 is electrically connected to the second comparison unit 112 to receive the first and second drain detection signals $S_{D1}$ and $S_{D2}$, and the third logic unit 115 output a second logic signal L2 and an inverted second logic signal L2$b$. The first output logic unit 116 is electrically connected to the first and second logic units 113 and 114 to receive the first and second logic signals L1 and L2, and the first output logic unit 116 output the P-type Miller plateau detection signal $V_{mP}$. The second output logic unit 117 is electrically connected to the first and second logic units 113 and 114 to receive the inverted first and second logic signals L1$b$ and L2$b$, and the second output logic unit 117 output the N-type Miller plateau detection signal $V_{mN}$.

In this embodiment, the first comparison unit 111 includes a first comparator 111$a$ and a second comparator 111$b$. The first comparator 111$a$ receives the high-potential reference voltage $V_{rH}$ via its negative input terminal, receives the gate-source voltage $V_{GS}$ via its positive input terminal and output the first source detection signal $S_{G1}$. The second comparator 111$b$ receives the low-potential reference voltage $V_{rL}$ via its negative input terminal, receives the gate-source voltage $V_{GS}$ via its positive input terminal and output the second source detection signal $S_{G2}$. The first comparator 111$a$ is provided to compare the gate-source voltage $V_{GS}$ to the high-potential reference voltage $V_{rH}$ to know the gate-source voltage $V_{GS}$ is larger or smaller than the high-potential reference voltage $V_{rH}$. The second comparator 111$b$ is provided to compare the gate-source voltage $V_{GS}$ to the low-potential reference voltage $V_{rL}$ to know the gate-source voltage $V_{GS}$ is larger or smaller than the low-potential reference voltage $V_{rL}$.

The first logic unit 113 includes a first exclusive OR (XOR) gate 113$a$, a first exclusive NOR (XNOR) gate 113$b$ and a first latch 113$c$. The first XOR gate 113$a$ is electrically connected to the first and second comparators 111$a$ and 111$b$ to receive the first and second source detection signals $S_{G1}$ and $S_{G2}$. The first XNOR gate 113$b$ is electrically connected to the first and second comparators 111$a$ and 111$b$ to receive the first and second source detection signals $S_{G1}$ and $S_{G2}$. An input terminal of the first latch 113$c$ is electrically connected to the first XOR gate 113$a$, and a reset terminal of the first latch 113$c$ is electrically connected to the first NXOR gate 113$b$. The first latch 113$c$ output the first logic signal L1 from an output terminal and output the inverted first logic signal L1$b$ from an inverting output terminal.

While the first and second source detection signals $S_{G1}$ and $S_{G2}$ are both high potentials or both low potentials, namely the gate-source voltage $V_{GS}$ is greater than both the high and low-potential reference voltages $V_{rH}$ and $V_{rL}$ or lower than both the high and low-potential reference voltages $V_{rH}$ and $V_{rL}$, output of the first XOR 113$a$ is low potential, output of the first NXOR gate 113$b$ is high potential, the first logic signal L1 output from the first latch 113$c$ is low potential, and the inverted first logic signal L1$b$ is high potential. As the first source detection signal $S_{G1}$ is lower potential and the second source detection signal $S_{G2}$ is high potential, in other words, when the gate-source voltage $V_{GS}$ is greater than the low-potential reference voltage $V_{rL}$ and lower than the high-potential reference voltage $V_{rH}$, output of the first XOR 113$a$ is high potential, output of the NXOR gate 113$b$ is low potential, the first logic signal L1 output from the first latch 113$c$ is high potential, and the inverted first logic signal L1$b$ is low potential. In this embodiment, it is available to know whether the gate-source voltage $V_{GS}$ is between the low and high-potential reference voltages $V_{rL}$ and $V_{rH}$ through the first logic unit 113.

The second logic unit 114 includes a AND gate 114$a$, a NOR gate 114$b$ and a second latch 114$c$ in this embodiment. The AND gate 114$a$ is electrically connected to the first and second comparators 111$a$ and 111$b$ to receive the first and second source detection signals $S_{G1}$ and $S_{G2}$. The NOR gate 114$b$ is electrically connected to the first and second comparators 111$a$ and 111$b$ to receive the first and second source detection signals S$_{G1}$ and S$_{G2}$. The second latch 114$c$ is electrically connected to the AND gate 114$a$ via its input terminal and electrically connected to the NOR gate 114$b$ via its reset terminal, and the second latch 114$c$ output the gate voltage detection signal V$_{PG}$ from its output terminal.

In the first case, when the first and second source detection signals S$_{G1}$ and S$_{G2}$ are both low potentials, it will be known that the gate-source voltage V$_{GS}$ is lower than both the low and high-potential reference voltages V$_{rH}$ and V$_{rL}$, output of the AND 114$a$ is low potential, output of the NOR gate 114$b$ is high potential, the gate voltage detection signal V$_{PG}$ output from the second latch 114$c$ is low potential. In the second case, if the first source detection signal S$_{G1}$ is lower potential and the second source detection signal S$_{G2}$ is high potential, that means the gate-source voltage V$_{GS}$ is greater than the low-potential reference voltage V$_{rL}$ and lower than the high-potential reference voltage V$_{rH}$, both of the AND 114$a$ and the NOR gate 114$b$ are high potentials, and the gate voltage detection signal V$_{PG}$ output from the second latch 114$c$ is still low potential. And in the third case, as the first and second source detection signals S$_{G1}$ and S$_{G2}$ are both high potentials, the gate-source voltage V$_{GS}$ is greater than both the low and high-potential reference voltages V$_{rH}$ and V$_{rL}$, output of the AND 114$a$ is high potential, output of the NOR gate 114$b$ is low potential, the gate voltage detection signal V$_{PG}$ output from the second latch 114$c$ is pulled up to high potential. In this embodiment, the second logic unit 114 is provided to know whether the gate-source voltage V$_{GS}$ is greater than both of the low and high-potential reference voltages V$_{rL}$ and V$_{rH}$.

The second comparison unit 112 includes a third comparator 112$a$ and a fourth comparator 112$b$. The third comparator 112$a$ receives the high-potential reference voltage V$_{rH}$ via its negative input terminal, receives the drain-source voltage V$_{DS}$ via its positive input terminal and it output the first drain detection signal S$_{D1}$. The fourth comparator 112$b$ receives the low-potential reference voltage V$_{rL}$ via its negative input terminal, receives the drain-source voltage V$_{DS}$ via its positive input terminal and output the second drain detection signal S$_{D2}$. The third comparator 112$a$ is provided to compare the drain-source voltage V$_{DS}$ to the high-potential reference voltage V$_{rH}$ so as to know the drain-source voltage V$_{DS}$ is larger or smaller than the high-potential reference voltage V$_{rH}$. The fourth comparator 112$b$ is provided to compare the drain-source voltage V$_{DS}$ to the low-potential reference voltage V$_{rL}$ to know the drain-source voltage V$_{DS}$ is higher or lower than the low-potential reference voltage V$_{rL}$.

In this embodiment, the third logic unit 115 includes a second XOR gate 115$a$, a second NXOR gate 115$b$ and a third latch 115$c$. The second XOR gate 115$a$ is electrically connected to the third and fourth comparators 112$a$ and 112$b$ to receive the first and second drain detection signals S$_{D1}$ and S$_{D2}$. The second XNOR gate 115$b$ is electrically connected to the third and fourth comparators 112$a$ and 112$b$ to receive the first and second drain detection signals S$_{D1}$ and S$_{D2}$. An input terminal of the third latch 115$c$ is electrically connected to the second XOR gate 115$a$, and a reset terminal of the third latch 115$c$ is electrically connected to the second NXOR gate 115$b$. The third latch 115$c$ output the second logic signal L2 from an output terminal and output the inverted second logic signal L2$b$ from an inverting output terminal.

When the first and second drain detection signals S$_{D1}$ and S$_{D2}$ are both high potentials or both low potentials, the drain-source voltage V$_{DS}$ is higher than both of the high and low-potential reference voltages V$_{rH}$ and V$_{rL}$ or lower than both of the high and low-potential reference voltages V$_{rH}$ and V$_{rL}$, output of the second XOR 115$a$ is low potential, output of the second NXOR gate 115$b$ is high potential, the second logic signal L2 from the third latch 115$c$ is low potential, and the inverted second logic signal L2$b$ is high potential. In another case, when the first drain detection signal S$_{D1}$ is lower potential and the second drain detection signal S$_{D2}$ is high potential, that is to say the drain-source voltage V$_{DS}$ is larger than the low-potential reference voltage V$_{rL}$ and smaller than the high-potential reference voltage V$_{rH}$, output of the second XOR 115$a$ is high potential, output of the second NXOR gate 115$b$ is low potential, the second logic signal L2 output from the third latch 115$c$ is high potential, and the inverted second logic signal L2$b$ is low potential. It is able to know whether the drain-source voltage V$_{DS}$ is between the low and high-potential reference voltages V$_{rL}$ and V$_{rH}$ using the third logic unit 115 in this embodiment.

With reference to FIG. 3, the first output logic unit 116 is a AND gate and is electrically connected to the output terminals of the first and third latches 113$c$ and 115$c$ to receive the first and second logic signals L1 and L2. The P-type Miller plateau detection signal V$_{mP}$ is usually low potential, and it is high potential only when both of the first and second logic signals L1 and L2 are high potentials. The second output logic unit 117 is a OR gate and is electrically connected to the inverting output terminals of the first and third latches 113$c$ and 115$c$ to receive the inverted first and second logic signals L1$b$ and L2$b$. The N-type Miller plateau detection signal V$_{mN}$ is high potential while the inverted first logic signal L1 or the inverted second logic signal L2 is high potential, and the N-type Miller plateau detection signal V$_{mN}$ is low potential while both of the inverted first and second logic signals L1 and L2 are low potentials. It is available to know the power transistor PT enter the Miller plateau when the gate-source voltage V$_{GS}$ and the drain-source voltage V$_{DS}$ are both between the low and high-potential reference voltages V$_{rL}$ and V$_{rH}$, and in the meantime, the P-type Miller plateau detection signal V$_{mP}$ is high potential, the N-type Miller plateau detection signal V$_{mN}$ is low potential. And the gate voltage detection signal V$_{PG}$ is high potential while the gate-source voltage V$_{GS}$ is greater than the low and high-potential reference voltages V$_{rL}$ and V$_{rH}$.

Figure 4:
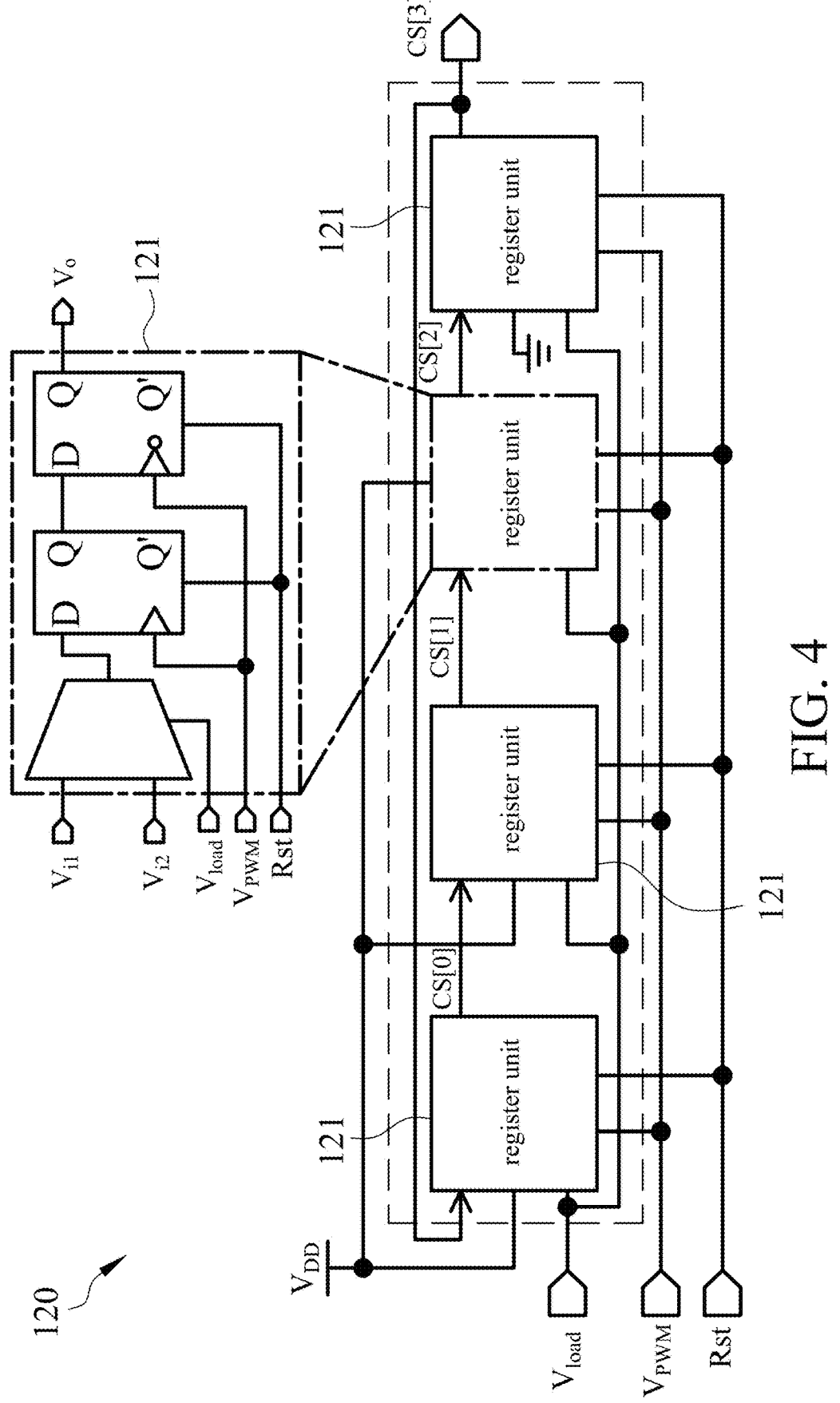
FIG. 4 is a circuit diagram illustrating a cycle shifter in accordance with one embodiment of the present invention.

With reference to FIG. 1, the cycle shifter 120 receives a load voltage signal V$_{load}$, a driving signal V$_{PWM}$ and a reset signal Rst, and output a sequence selection signal CS[0:3] depending on the load voltage signal V$_{load}$ and the driving signal V$_{PWM}$. The sequence selection signal CS[0:3] from the cycle shifter 120 is utilized to turn off some PMOS transistors in the PMOS buffer array 160 while the gate voltage detection signal V$_{PG}$ is high potential, thereby lowering power consumption. The load voltage signal V$_{load}$ is the external data input to the cycle shifter 120 as the initial sequence data, the driving signal V$_{PWM}$ is the system control signal of the active gate driver 100, used to decide turning on or off the power transistor PT and used as the clock signal in the cycle shifter 120, and the reset signal Rst is used to reset the cycle shifter 120. Referring to FIG. 4, the cycle shifter 120 is a parallel in parallel out (PIPO) shift register in this embodiment, and it consists of four register units 121 each having a multiplexer and two flip flops. Input signals of each of the register units 121 are represented as V$_{i1}$ and V$_{i2}$ and output signal of each of the register units 121 is represented as V$_o$ in FIG. 4. After receiving the initial sequence date of the load voltage signal $V_{load}$, the cycle shifter 120 is triggered by the driving signal $V_{PWM}$ to move data bits in the sequence selection signal CS[0:3], e.g. moving [0011] to [1001] to turn off the third and fourth PMOS transistors in the first cycle and turn off the first and fourth PMOS transistors in the second cycle. As a result, different PMOS transistors in the PMOS buffer array 160 can be turned off in every cycle to lower aging difference of the PMOS transistors in the PMOS buffer array 160.

Figure 5:
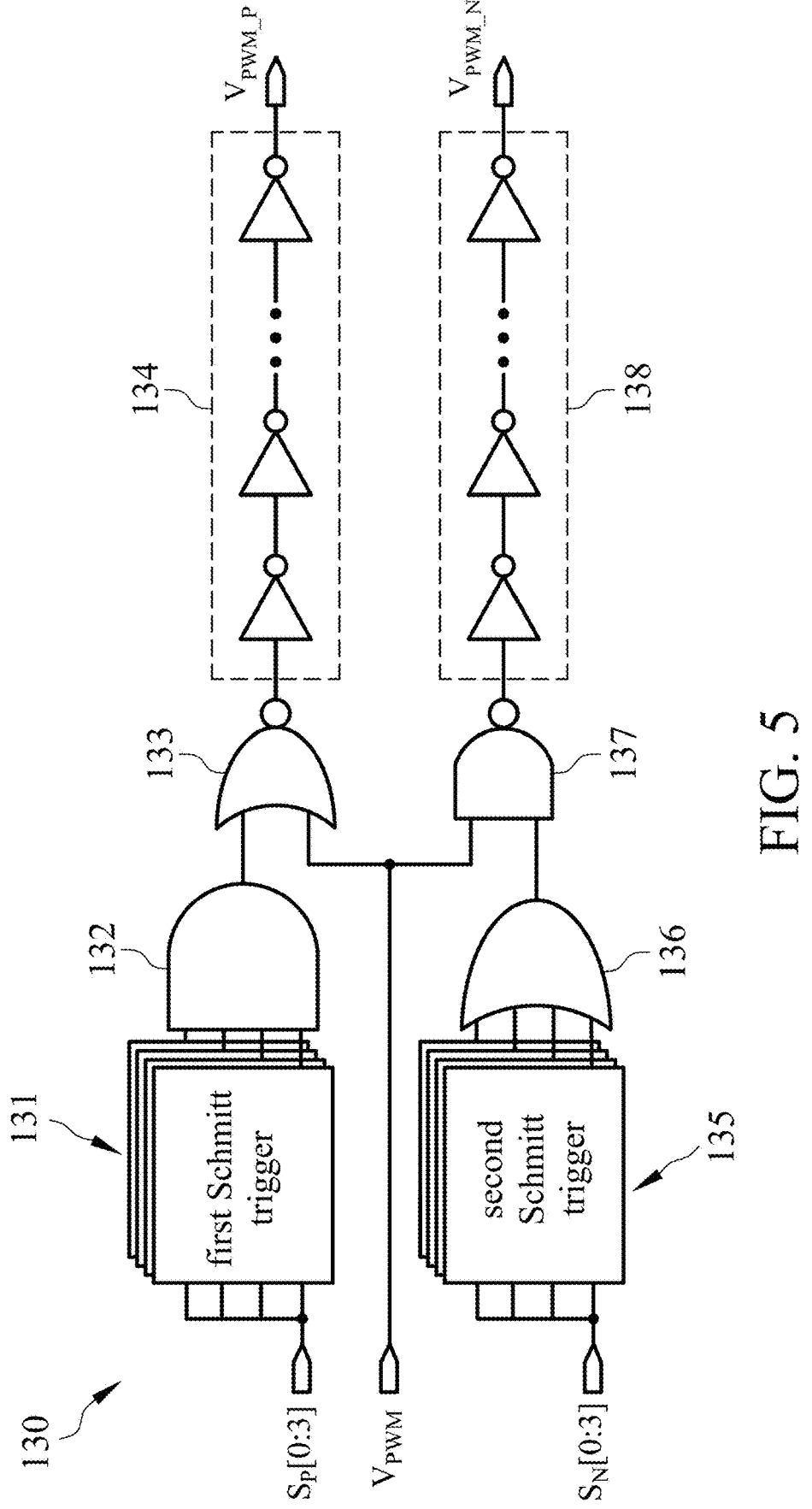
FIG. 5 is a circuit diagram illustrating a flexible split-path feedback circuit in accordance with one embodiment of the present invention.

With reference to FIG. 1, the flexible split-path feedback circuit 130 receives the driving signal $V_{PWM}$, a P-type control signal $S_P[0:3]$ and a N-type control signal $S_N[0:3]$, and output a P-type driving signal $V_{PWM\_P}$ and a N-type driving signal $V_{PWM\_N}$. As shown in FIG. 5, the flexible split-path feedback circuit 130 includes multiple first Schmitt triggers 131, a AND gate 132, a NOR gate 133, a first inverter chain 134, multiple second Schmitt triggers 135, a OR gate 136, a NAND gate 137 and a second inverter chain 138. In this embodiment, there are four first Schmitt triggers 131 and four second Schmitt triggers 135 in the flexible split-path feedback circuit 130. The first Schmitt triggers 131 receive the bits of the P-type control signal $S_P[0:3]$, the AND gate 132 is electrically connected to the first Schmitt triggers 131, the NOR gate 133 is electrically connected to the AND gate 132 and receives the driving signal $V_{PWN}$, the first inverter chain 134 is electrically connected to the NOR gate 133 and output the P-type driving signal $V_{PWN\_P}$. The second Schmitt triggers 135 receive the bits of the N-type control signal $S_N[0:3]$, the OR gate 136 is electrically connected to the second Schmitt triggers 135, the NAND gate 137 is electrically connected to the OR gate 136 and receives the driving signal $V_{PWN}$, the second inverter chain 138 is electrically connected to the NAND gate 137 and output the N-type driving signal $V_{PWN\_N}$. The P-type and N-type driving signals $V_{PWM\_P}$ and $V_{PWN\_N}$ from the flexible split-path feedback circuit 130 are coupled to the PMOS switch picker 140 and the NMOS switch picker 150, respectively, to control the PMOS switch picker 140 and the NMOS switch picker 150. Thus, the PMOS buffer array 160 and the NMOS buffer array 170 will not be turned on at the same time to make short-circuit current.

Figure 6:
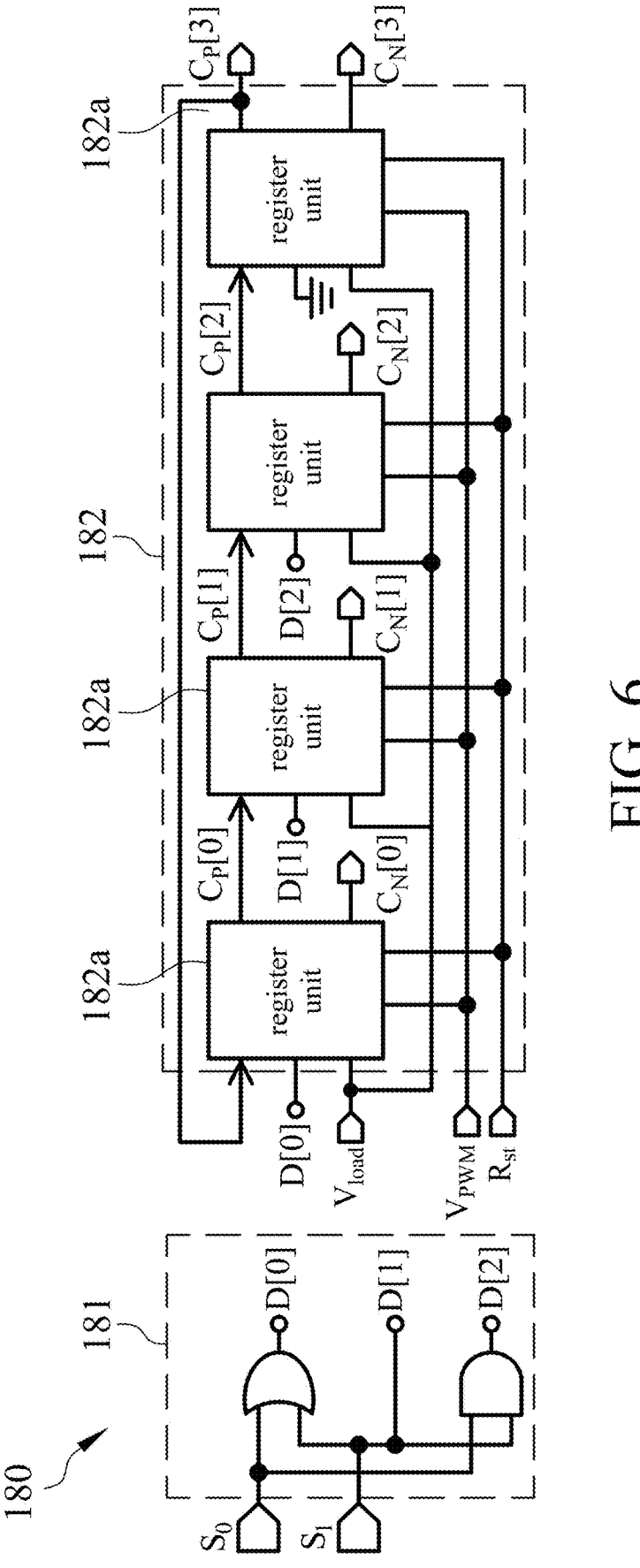
FIG. 6 is a circuit diagram illustrating a configurable drive current selector circuit in accordance with one embodiment of the present invention.

With reference to FIG. 1, the configurable drive current selector circuit 180 receives a mode selection control signal $S_0$, $S_1$, the load voltage signal $V_{load}$ and the driving signal $V_{PWN}$, and the configurable drive current selector circuit 180 output a P-type drive current control signal $C_P[0:3]$ to the PMOS switch picker 140 and output a N-type drive current control signal $C_N[0:3]$ to the NMOS switch picker 150 so as to decide how many PMOS and NMOS transistors will be turned off as the power transistor PT in the Miller plateau. As shown in FIG. 6, the configurable drive current selector circuit 180 includes a mode decoder 181 and a shift register 182 in this embodiment. The mode decoder 181 receives the mode selection signal $S_0$, $S_1$ and output a mode selection decoded signal D[0:2]. The shift register 182 is electrically connected to the mode decoder 181 to receive the mode selection decoded signal D[0:2], the shift register 182 also receives the load voltage signal $V_{load}$ and the driving signal $V_{PWN}$ and output the P-type and N-type drive current control signals $C_P[0:3]$ and $C_N[0:3]$. Similar to the cycle shifter 120, the shift register 182 of this embodiment is also a PIPO shifted register including four register units 182a, component composition and signal control of the register units 182a are similar to the register unit 121 in the cycle shifter 120, no more detailed description here. The mode selection control signal $S_0$, $S_1$, which is control mode input externally, is decoded into the mode selection decoded signal with three bits D[0], D[1] and D[2] used to control the three register units 182a of the shift register 182, respectively. The mode selection decoded signal D[0], D[1] and D[2] is provided to determine how many times of the data in the shift register 182 have to be moved. For example, three PMOS transistors and three NMOS transistors need to be turned off if the power transistor PT is in the Miller plateau, the first three PMOS transistors and the first three NMOS transistors are turned off when the P-type drive current control signal $C_P[0:3]$ is [1110] and the N-type drive current control signal $C_N[0:3]$ is [0001] in the first cycle, the P-type drive current control signal $C_P[0:3]$ output from the configurable drive current selector circuit 180 is moved to [0111] and the N-type drive current control signal $C_N[0:3]$ output from the configurable drive current selector circuit 180 is moved to [1000] in the second cycle to turn off the last three PMSO transistors and the last three NMOS transistors. Accordingly, the PMOS transistors of the PMOS buffer array 160 and the NMOS transistors of the NMOS buffer array 170 can have similar aging levels.

Figures 7, 8:
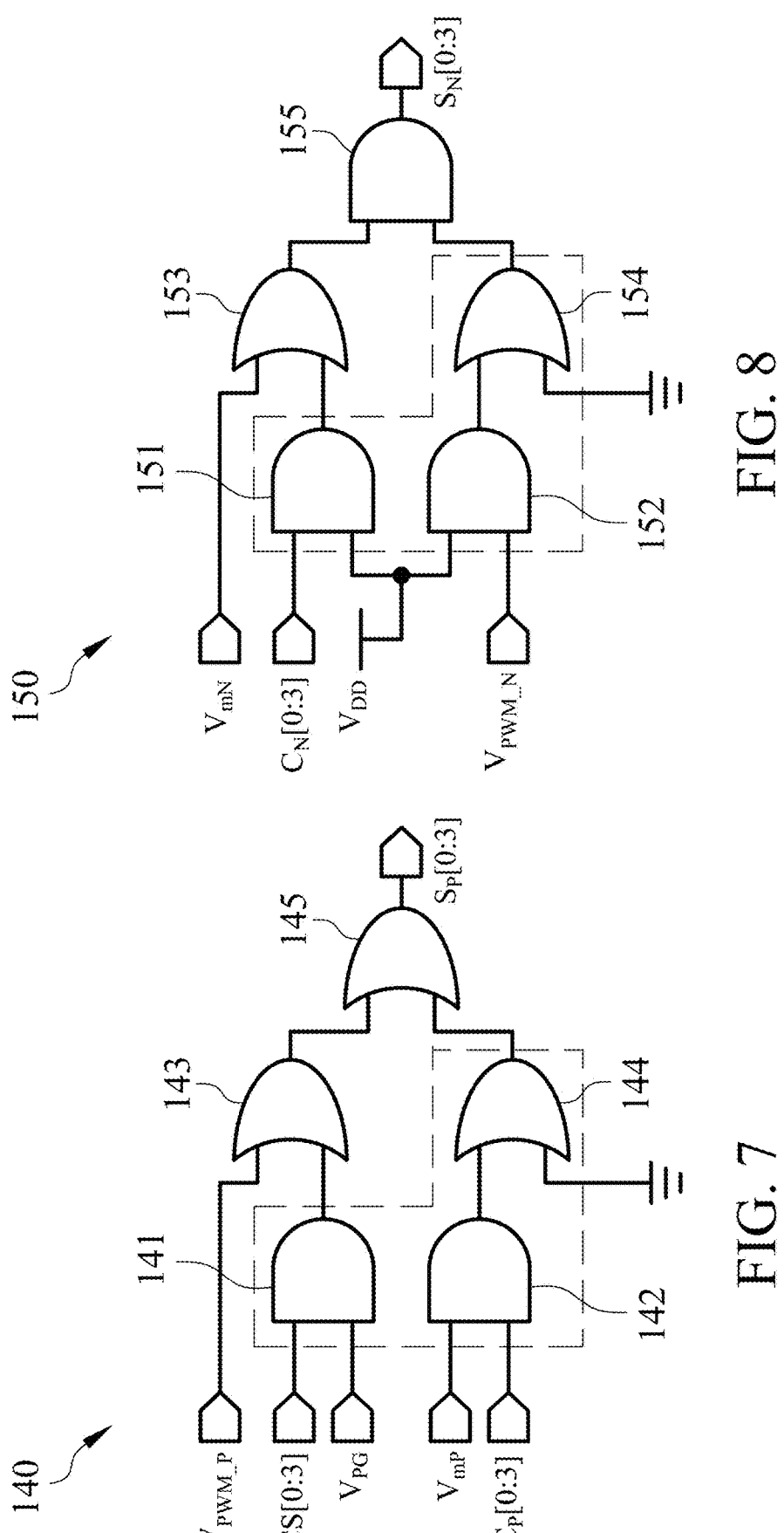
FIG. 7 is a circuit diagram illustrating a PMOS switch picker in accordance with one embodiment of the present invention.
FIG. 8 is a circuit diagram illustrating a NMOS switch picker in accordance with one embodiment of the present invention.

With reference to FIG. 1, the PMOS switch picker 140 is electrically connected to the two-level Miller plateau detector 110, the cycle shifter 120, the flexible split-path feedback circuit 130 and the configurable drive current selector circuit 180. The PMOS switch picker 140 receives the P-type Miller plateau detection signal $V_{mP}$, the gate voltage detection signal $V_{PG}$, the sequence selection signal CS[0:3] and the P-type driving signal $V_{PWN\_P}$, and output the P-type control signal $S_P[0:3]$. Referring to FIG. 7, the PMOS switch picker 140 includes a first AND gate 141, a second AND gate 142, a first OR gate 143, a second OR gate 144 and a third OR gate 145 in this embodiment. The first AND gate 141 is electrically connected to the cycle shifter 120 and the two-level Miller plateau detector 110 to receive the sequence selection signal CS[0:3] and the gate voltage detection signal $V_{PG}$. The second AND gate 142 is electrically connected to the two-level Miller plateau detector 110 and the configurable drive current selector circuit 180 to receive the P-type Miller plateau detection signal $V_{mP}$ and the P-type drive current control signal $C_P[0:3]$. The first OR gate 143 is electrically connected to the flexible split-path feedback circuit 130 and the first AND gate 141 to receive the P-type driving signal $V_{PWN\_P}$ and an output signal of the first AND gate 141. The second OR gate 144 is electrically connected to the second AND gate 142 and a ground terminal to receive an output signal of the second AND gate 142. The third OR gate 145 is electrically connected to the first and second OR gates 143 and 144 to receive output signa of the first and second OR gates 143 and 144, and the P-type control signal $S_P[0:3]$ is output from the third OR gate 145.

With reference to FIG. 7, the first AND gate 141 receives the sequence selection signal CS[0:3] and the gate voltage detection signal $V_{PG}$. The PMOS transistors in the PMOS buffer array 160 are controlled by the sequence selection signal CS[0:3] and some PMOS transistors are turned off while the gate voltage detection signal $V_{PG}$ is high potential, in other words, while the gate-source voltage $V_{GS}$ is greater than the low and high-potential reference voltages $V_{rL}$ and $V_{rH}$. In addition, the turned-off PMOS transistors are different in every cycle. The second AND gate 142 receives the P-type Miller plateau detection signal $V_{mP}$ and the P-type drive current control signal $C_P[0:3]$, and it can utilize the P-type drive current control signal $C_P[0:3]$ to control the PMOS transistors in the PMOS buffer array 160 and turn off some the PMOS transistors when the P-type Miller plateau detection signal $V_{mP}$ is high potential and the power transistor PT enters the Miller plateau. Similarly, the second AND gate 142 can turn off different PMOS transistors in every cycle. Some of the PMOS transistors in the PMOS buffer array 160 can be turned off by the gate voltage detection signal $V_{PG}$, the sequence selection signal CS[0:3], the P-type Miller plateau detection signal $V_{mP}$ and the P-type drive current control signal $C_P$[0:3] as the power transistor PT enters the Miller plateau or the gate-source voltage $V_{GS}$ is greater than the low and high-potential reference voltages $V_{rL}$ and $V_{rH}$, thereby lowering power consumption of the active gate driver 100. Besides, the sequence selection signal CS[0:3] and the P-type drive current control signal $C_P$[0:3] are shifted in every cycle so the turned-off PMOS transistors are different in every cycle to ensure symmetric aging of the PMOS transistors.

With reference to FIG. 1, the NMOS switch picker 150 is electrically connected to the two-level Miller plateau detector 110, the cycle shifter 120, the flexible split-path feedback circuit 130 and the configurable drive current selector circuit 180. The NMOS switch picker 150 receives the N-type Miller plateau detection signal $V_{mN}$ and the N-type driving signal $V_{PWN\_N}$, and output the N-type control signal $S_N$[0:3]. As shown in FIG. 8, the NMOS switch picker 150 includes a third AND gate 151, a fourth AND gate 152, a fourth OR gate 153, a fifth OR gate 154 and a fifth AND gate 155. The third AND gate 151 is electrically connected to the configurable drive current selector circuit 180 and receives the N-type drive current control signal $C_N$[0:3] and the supply voltage $V_{DD}$. The fourth AND gate 152 is electrically connected to the flexible split-path feedback circuit 130 and receives the N-type driving signal $V_{PWM\_N}$ and the supply voltage $V_{DD}$. The fourth OR gate 153 is electrically connected to the two-level Miller plateau detector 110 and the third AND gate 151 to receive the N-type Miller plateau detection signal $V_{mN}$ and an output signal of the third AND gate 151. The fifth OR gate 154 is electrically connected to the fourth AND gate 152 and a ground terminal to receive an output signal of the fourth AND gate 152. The fifth AND gate 155 is electrically connected to the fourth and fifth OR gates 153 and 154 to receive output signals of the fourth and fifth OR gates 153 and 154, and the fifth OR gate 155 output the N-type control signal $S_N$[0:3].

With reference to FIG. 8, the fourth OR gate 153 receives the N-type Miller plateau detection signal $V_{mN}$ and the N-type drive current control signal $C_N$[0:3]. The fourth OR gate 153 can control the NMOS transistors in the NMOS buffer array 170 using the N-type drive current control signal $C_N$[0:3] and turn off some of the NMOS transistors when the N-type Miller plateau detection signal $V_{mN}$ is low potential, namely when the power transistor PT enters the Miller plateau, and it can turn off different NMOS transistors in every cycle. Because of the N-type Miller plateau detection signal $V_{mN}$ and the N-type drive current control signal $C_N$[0:3], some of the NMOS transistors in the NMOS buffer array 170 can be turned off as the power transistor PT enters the Miller plateau, and power consumption of the active gate driver 100 can be reduced.

Preferably, the amount of logic units in the PMOS switch picker 140 is identical to that in the NMOS switch picker 150 such that the P-type and N-type control signals $S_P$[0:3] and $S_N$[0:3] can be synchronized.

With reference to FIG. 1, the voltage level converter 190 is electrically connected to the PMOS switch picker 140 to receive the P-type control signal $S_P$[0:3], and it can convert the voltage level of the P-type control signal $S_P$[0:3]. The converted P-type control signal $S_P$[0:3] is sent to the PMOS buffer array 160 to control the PMOS buffer array 160. The delay matching circuit 200 is electrically connected to the NMOS switch picker 150 to receive the N-type control signal $S_N$[0:3] and provided to delay the N-type control signal $S_N$[0:3], thus the delayed N-type control signal $S_N$[0:3] is synchronized to the converted P-type control signal $S_P$[0:3]. And the delayed N-type control signal $S_N$[0:3] is sent to the NMOS buffer array 170 from the delay matching circuit 200 to control the NMOS buffer array 170.

The circuit control consists of six phases in the present invention. In phase 1, the driving signal $V_{PWN}$ goes up to high potential, the P-type and N-type driving signals $V_{PWN\_P}$ and $V_{PWN\_N}$ go down to low potential, all PMOS transistors in the PMOS buffer array 160 are turned on, all NMOS transistors in the NMOS buffer array 170 are turned off, the PMOS buffer array 160 provides a large current to the gate of the power transistor PT, and at this time, the gate-source voltage $V_{GS}$ is pulled up to be greater than the low-potential reference voltage $V_{rL}$. In phase 2, the P-type and N-type driving signals $V_{PWN\_P}$ and $V_{PWN\_N}$ are still low potential, the drain-source voltage $V_{DS}$ starts to fall, the P-type Miller plateau detection signal $V_{mP}$ goes up to high potential and the N-type Miller plateau detection signal $V_{mN}$ goes down to low potential while the drain-source voltage $V_{DS}$ is lower than the high-potential reference voltage $V_{rH}$, that indicates the power transistor PT enters the Miller plateau, and the PMOS buffer array 160 is controlled by the P-type drive current control signal $C_P$[0:3] to turn off some PMOS transistors for lowering power consumption. In phase 3, the drain-source voltage $V_{DS}$ falls to be lower than the low-potential reference voltage $V_{rL}$, the P-type Miller plateau detection signal $V_{mP}$ falls to be low potential, it can be known that the power transistor PT leaves the Miller plateau, and now all PMOS transistors in the PMOS buffer array 160 are turned on to provide large current to the power transistor PT, but the gate voltage detection signal $V_{PG}$ is pulled up to high potential after the gate-source voltage $V_{GS}$ rises to exceed the high-potential reference voltage $V_{rH}$, and the PMOS buffer array 160 is controlled by the sequence selection signal CS[0:3] to turn off some PMOS transistors to lower power consumption. Next, in phase 4, the driving signal $V_{PWN}$ falls to low potential, the P-type and N-type driving signals $V_{PWN\_P}$ and $V_{PWN\_N}$ rise to high potential, all PMOS transistors in the PMOS buffer array 160 are turned off, all NMOS transistors in the NMOS buffer array 170 are turned on, then the NMOS buffer array 170 provides a discharge path for over current to the gate of the power transistor PT, and now the gate-source voltage $V_{GS}$ starts to fall to be lower than the high-potential reference voltage $V_{rH}$. In phase 5, the drain-source voltage $V_{DS}$ starts to rise, the P-type Miller plateau detection signal $V_{mP}$ rises to high potential and the N-type Miller plateau detection signal $V_{mN}$ fall down to low potential while the drain-source voltage $V_{DS}$ go up to exceed the low-potential reference voltage $V_{rL}$, indicating the power transistor PT enters the Miller plateau, thus the NMOS buffer array 170 is controlled by the N-type drive current control signal $C_N$[0:3] to turn off some NMOS transistor to lower power consumption. In phase 6, the N-type Miller plateau detection signal $V_{mN}$ goes up to high potential and the power transistor PT leaves the Miller plateau when the drain-source voltage $V_{DS}$ rises to be higher than the high-potential reference voltage $V_{rH}$, then all NMOS transistors in the NMOS buffer array 170 are turned on to provide a discharge path for over current to the gate of the power transistor PT. Consequently, this embodiment can turn off some PMOS transistors in PMOS buffer array 160 and turn off some NMPS transistors in the NMOS buffer array 170 to lower power consumption while the power transistor PT enters the Miller plateau, and also can turn off some PMOS transistors in the PMOS buffer array 160 to minimize power consumption when the gate-source voltage $V_{GS}$ rises to exceed the high-potential reference voltage $V_{rH}$.

In the active gate driver 100 of the present invention, the two-level Miller plateau detector 110 is provided to detect whether the power transistor PT is in the Miller plateau such that it is feasible to turn off some PMOS transistors in the PMOS buffer array 160 or some NMOS transistors in the NMOS buffer array 170 to lower power consumption as the power transistor PT is in the Miller plateau. Moreover, some of the PMOS transistors in the PMOS buffer array 160 can be turned off to further reduce power consumption when the gate-source voltage $V_{GS}$ is pulled up to reach the high-potential reference voltage $V_{rH}$. And the turned-off PMOS transistors in every cycle are changed by the cycle shifter 120 to avoid asymmetric PMOS transistor aging in the PMOS buffer array 160.

The scope of the present invention is only limited by the following claims. Any alternation and modification without departing from the scope and spirit of the present invention will become apparent to those skilled in the art.

The invention claimed is:

1. An active gate driver configured to drive a power transistor comprising:

a two-level Miller plateau detector electrically connected to the power transistor and configured to receive a gate-source voltage and a drain-source voltage of the power transistor, the two-level Miller plateau detector is configured to compare the gate-source voltage and the drain-source voltage to a high-potential reference voltage and a low-potential reference voltage and output a P-type Miller plateau detection signal, a N-type Miller plateau detection signal and a gate voltage detection signal;

a cycle shifter configured to receive a load voltage signal and a driving signal and output a sequence selection signal depending on the load voltage signal and the driving signal;

a flexible split-path feedback circuit configured to receive the driving signal, a P-type control signal and a N-type control signal and output a P-type driving signal and a N-type driving signal;

a PMOS switch picker electrically connected to the two-level Miller plateau detector, the cycle shifter and the flexible split-path feedback circuit, the PMOS switch picker is configured to receive the P-type Miller plateau detection signal, the gate voltage detection signal, the sequence selection signal and the P-type driving signal and configured to output the P-type control signal;

a NMOS switch picker electrically connected to the two-level Miller plateau detector, the cycle shifter and the flexible split-path feedback circuit, the NMOS switch picker is configured to receive the N-type Miller plateau detection signal and the N-type driving signal and configured to output the N-type control signal;

a PMOS buffer array electrically connected to the PMOS switch picker and configured to receive the P-type control signal, the PMOS buffer array is controlled by the P-type control signal to provide a gate voltage to the power transistor; and a NMOS buffer array electrically connected to the NMOS switch picker and configured to receive the N-type control signal, the NMOS buffer array is controlled by the N-type control signal to provide a discharge path for the power transistor.

2. The active gate driver in accordance with claim 1, wherein the two-level Miller plateau detector includes:

a first comparison unit configured to receive the gate-source voltage, the high and low-potential reference voltages, compare the gate-source voltage to the high and low-potential reference voltages and output a first source detection signal and a second source detection signal;

a second comparison unit configured to receive the drain-source voltage, the high and low-potential reference voltages, compare the drain-source voltage to the high and low-potential reference voltages and output a first drain detection signal and a second drain detection signal;

a first logic unit electrically connected to the first comparison unit and configured to receive the first and second source detection signals and output a first logic signal and an inverted first logic signal;

a second logic unit electrically connected to the first comparison unit and configured to receive the first and second source detection signals and output the gate voltage detection signal;

a third logic unit electrically connected to the second comparison unit and configured to receive the first and second drain detection signals and output a second logic signal and an inverted second logic signal;

a first output logic unit electrically connected to the first and second logic units and configured to receive the first and second logic signals and output the P-type Miller plateau detection signal; and a second output logic unit electrically connected to the first and second logic units and configured to receive the inverted first and second logic signals and output the N-type Miller plateau detection signal.

3. The active gate driver in accordance with claim 2, wherein the first comparison unit includes a first comparator and a second comparator, the second comparison unit includes a third comparator and a fourth comparator, a negative input terminal of the first comparator is configured to receive the high-potential reference voltage, a positive input terminal of the first comparator is configured to receive the gate-source voltage, the first comparator is configured to output the first source detection signal, a negative input terminal of the second comparator is configured to receive the low-potential reference voltage, a positive input terminal of the second comparator is configured to receive the gate-source voltage, the second comparator is configured to output the second source detection signal, a negative input terminal of the third comparator is configured to receive the high-potential reference voltage, a positive input terminal of the third comparator is configured to receive the drain-source voltage, the third comparator is configured to output the first drain detection signal, a negative input terminal of the fourth comparator is configured to receive the low-potential reference voltage, a positive input terminal of the fourth comparator is configured to receive the drain-source voltage, the fourth comparator is configured to output the second drain detection signal.

4. The active gate driver in accordance with claim 3, wherein the first logic unit includes a first XOR gate, a first XNOR gate and a first latch, the first XOR gate is electrically connected to the first and second comparators and configured to receive the first and second source detection signals, the first XNOR gate is electrically connected to the first and second comparators and configured to receive the first and second source detection signals, an input terminal of the first latch is electrically connected to the first XOR gate, and a reset terminal of the first latch is electrically connected to the first NXOR gate, an output terminal of the first latch is configured to output the first logic signal, and an inverting output terminal of the first latch is configured to output the inverted first logic signal, the second logic unit includes a AND gate, a NOR gate and a second latch, the AND gate is electrically connected to the first and second comparators and configured to receive the first and second source detection signals, the NOR gate is electrically connected to the first and second comparators and configured to receive the first and second source detection signals, an input terminal of the second latch is electrically connected to the AND gate, a reset terminal of the second latch is electrically connected to the NOR gate, a output terminal of the second latch is configured to output the gate voltage detection signal, the third logic unit includes a second XOR gate, a second NXOR gate and a third latch, the second XOR gate is electrically connected to the third and fourth comparators and configured to receive the first and second drain detection signals, the second XNOR gate is electrically connected to the third and fourth comparators and configured to receive the first and second drain detection signals, an input terminal of the third latch is electrically connected to the second XOR gate, a reset terminal of the third latch is electrically connected to the second NXOR gate, an output terminal of the third latch is configured to output the second logic signal, and an inverting output terminal of the third latch is configured to output the inverted second logic signal.

5. The active gate driver in accordance with claim 4, wherein the first output logic unit which is a AND gate is electrically connected to the output terminals of the first and third latches and configured to receive the first and second logic signals, the second output logic unit which is a OR gate is electrically connected to the inverting output terminals of the first and third latches and configured to receive the inverted first and second logic signals.

6. The active gate driver in accordance with claim 1, wherein the cycle shifter is a parallel in parallel out (PIPO) shift register.

7. The active gate driver in accordance with claim 1, wherein the flexible split-path feedback circuit includes a plurality of first Schmitt triggers, a AND gate, a NOR gate, a first inverter chain, a plurality of second Schmitt triggers, a OR gate, a NAND gate and a second inverter chain, the plurality of first Schmitt triggers are configured to receive the P-type control signal, the AND gate is electrically connected to the plurality of first Schmitt triggers, the NOR gate is electrically connected to the AND gate and configured to receive the driving signal, the first inverter chain is electrically connected to the NOR gate and configured to output the P-type driving signal, the plurality of second Schmitt triggers are configured to receive the N-type control signal, the OR gate is electrically connected to the plurality of second Schmitt triggers, the NAND gate is electrically connected to the OR gate and configured to receive the driving signal, the second inverter chain is electrically connected to the NAND gate and configured to output the N-type driving signal.

8. The active gate driver in accordance with claim 1 further comprising a configurable drive current selector circuit, wherein the configurable drive current selector circuit includes a mode decoder and a shift register, the mode decoder is configured to receive a mode selection control signal and output a mode selection decoded signal, the shift register is electrically connected to the mode decoder, configured to receive the mode selection decoded signal, the load voltage signal, and the driving signal and configured to output a P-type drive current control signal and a N-type drive current control signal.

9. The active gate driver in accordance with claim 8, wherein the PMOS switch picker includes a first AND gate, a second AND gate, a first OR gate, a second OR gate and a third OR gate, the NMOS switch picker includes a third AND gate, a fourth AND gate, a fourth OR gate, a fifth OR gate and a fifth AND gate, the first AND gate is electrically connected to the cycle shifter and the two-level Miller plateau detector and configured to receive the sequence selection signal and the gate voltage detection signal, the second AND gate is electrically connected to the two-level Miller plateau detector and the configurable drive current selector circuit and configured to receive the P-type Miller plateau detection signal and the P-type drive current control signal, the first OR gate is electrically connected to the flexible split-path feedback circuit and the first AND gate and configured to receive the P-type driving signal and an output signal of the first AND gate, the second OR gate is electrically connected to the second AND gate and a ground terminal and configured to receive an output signal of the second AND gate, the third OR gate is electrically connected to the first and second OR gates and configured to receive output signals of the first and second OR gates and output the P-type control signal, the third AND gate is electrically connected to the configurable drive current selector circuit and configured to receive the N-type drive current control signal and a supply voltage, the fourth AND gate is electrically connected to the flexible split-path feedback circuit and configured to receive the N-type driving signal, the fourth OR gate is electrically connected to the two-level Miller plateau detector and the third AND gate and configured to receive the N-type Miller plateau detection signal and an output signal of the third AND gate, the fifth OR gate is electrically connected to the fourth AND gate and a ground terminal and configured to receive an output signal of the fourth AND gate, the fifth AND gate is electrically connected to the fourth and fifth OR gates and configured to receive output signals of the fourth and fifth OR gates and output the N-type control signal.

10. The active gate driver in accordance with claim 1 further comprising a voltage level converter and a delay matching circuit, wherein the voltage level converter is electrically connected to the PMOS switch picker and configured to receive the P-type control signal, convert voltage level of the P-type control signal and send the converted P-type control signal to the PMOS buffer array, the delay matching circuit is electrically connected to the NMOS switch picker and configured to receive the N-type control signal, delay the N-type control signal to synchronize the delayed N-type control signal with the converted P-type control signal and send the delayed N-type control signal to the NMOS buffer array.

* * * * *